United States Patent [19]
Kellogg et al.

[11] 3,967,192
[45] June 29, 1976

[54] INDICATOR LAMP TEST CIRCUIT UTILIZING BIDIRECTIONAL THYRISTOR SWITCHING

[75] Inventors: Walter J. Kellogg, Beaver; Chester W. Calvin, Beaver Falls, both of Pa.

[73] Assignee: Westinghouse Electric Corporation, Pittsburgh, Pa.

[22] Filed: Aug. 8, 1974

[21] Appl. No.: 495,756

[52] U.S. Cl. .................................. 324/21; 315/132; 340/251
[51] Int. Cl.² .................... G01R 31/22; H05B 37/03
[58] Field of Search .................... 315/129, 131, 132; 324/21, 20, 51, 22; 340/251, 213, 214

[56] References Cited
UNITED STATES PATENTS

| | | | |
|---|---|---|---|
| 3,135,913 | 6/1964 | Hodgdon | 315/131 X |
| 3,840,801 | 10/1974 | Kellogg et al. | 324/21 |
| 3,842,343 | 10/1974 | Taylor et al. | 324/21 |

*Primary Examiner*—Gerard R. Strecker
*Attorney, Agent, or Firm*—R. E. Converse, Jr.

[57] ABSTRACT

A circuit is provided for test and operation of indicator lights wherein multiple lights may be tested simultaneously by pushing one button and closing one set of normally open contacts and the individual indicator lights are operated from a circuit utilizing a self-triggering bidirectional thyristor. The test pushbutton and the indicator operating signal circuit operate at a higher voltage, such as 120 volts ac, and the indicator lamp is operated at a low voltage, such as 6 volts ac, providing safety and allowing use of inexpensive incandescent indicator bulbs. One indicator transformer is required for each indicator light. A diode is provided in the test circuit on the high voltage side of each of the indicator transformers to permit a test signal to activate the indicator lamps without affecting the rest of the circuit. The diodes in the test circuit permit only unidirectional current to flow therethrough. The operating signal circuit is also connected to the high voltage side of each transformer, in parallel with the test circuit. A bidirectional thyristor is used to switch the indicator circuit on lighting the indicator lamp and providing circuit isolation. The bidirectional thyristor is connected so to be self-triggering and when current flows in the line to which the thyristor is connected the thyristor is triggered on energizing the transformer and lighting the indicating lamp. The lumination of the indicator lamps when activated through the test circuit is less than the lumination when activated through the normal indicator signal circuit.

11 Claims, 1 Drawing Figure

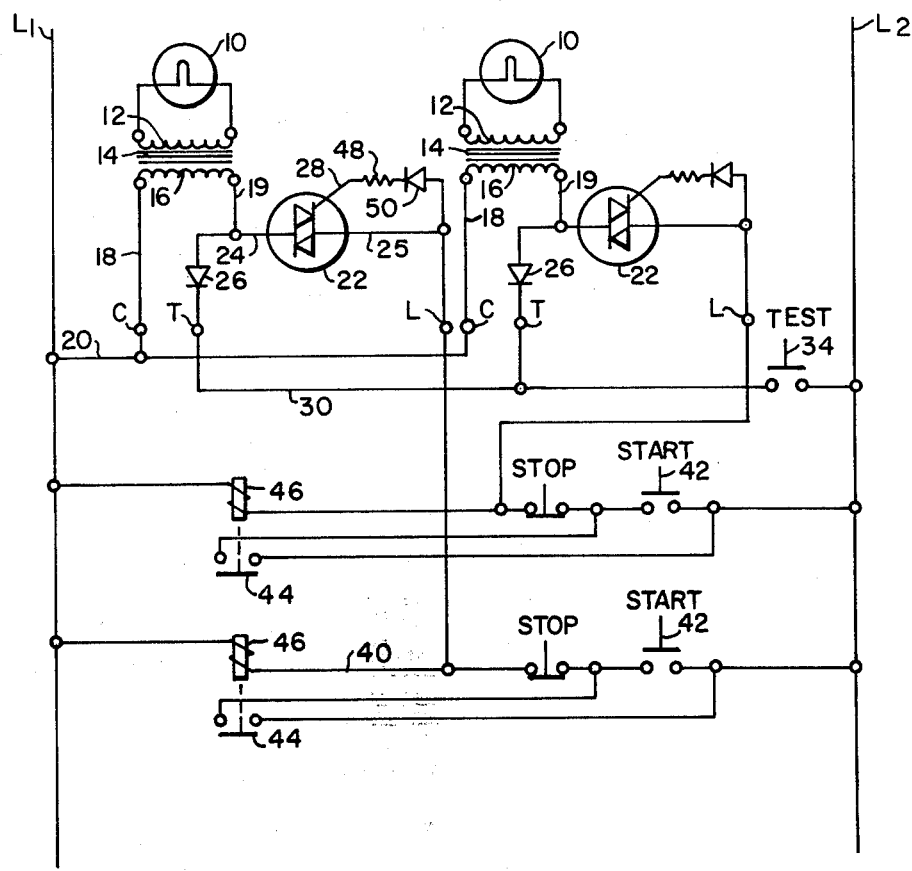

INDICATOR LAMP TEST CIRCUIT UTILIZING BIDIRECTIONAL THYRISTOR SWITCHING

BACKGROUND OF THE INVENTION

This invention relates to a test circuit for an indicator lamp and more particularly to an improved circuit for simultaneously testing indicator lamps utilizing a self-triggering bidirectional thyristor.

On modern machinery there are many applications where multiple indicator lights are used. It is advantageous to have a means of rapidly testing many indicator lamps by depressing a single pushbutton. A problem with some of the prior art test circuits is that many relays or multipole pushbuttons are required in the test circuit. In some of the prior art indicator circuits, the normal signal circuits, the test circuits and the indicator lamp circuits are all operated at the same potential. It is desirable to have a circuit in which the test pushbutton and the indicator signal are at a higher normal operating voltage, such as 120 volts, while the indicator lamp is maintained at a low voltage, such as 6 volts, for system safety and cost.

In prior art U.S. Pat. No. 3,040,243 issued June 19, 1962 to I.F. Weiss a test circuit for an indicator system utilizing a single test button is disclosed. A problem with this circuit as disclosed in Weiss is that a separate transformer is required for the test circuit. The separate transformer can cause polarity and installation disabilities. In this prior art circuit the isolating diodes are disposed on the low voltage side of the indicator transformers. In a low voltage indicator lamp circuit voltage drop across the diodes can be significant. Also the disclosed circuit applies ½ wave rectified current to the bulb in both the normal and test conditions making it necessary to apply 8 to 10 volts or more to get a bright enough indication.

It is desirable to have a single pushbutton test circuit and operating circuit combination which is highly reliable and not susceptible to showing erroneous indications.

SUMMARY OF THE INVENTION

An indicator lamp circuit is provided in which multiple indicator lamps can be tested by depressing a single normally open pushbutton. Each indicator lamp is directly connected to the low voltage side of an indicator transformer. A test circuit and an operating signal circuit are connected to one leg of the primary high voltage side of the indicator transformer. A diode is disposed in the test circuit connection to the primary leg of each of the indicator transformers. A normally open pushbutton is connected in the test circuit to complete a circuit through the primaries of all of the indicator transformers when depressed. This allows for simultaneous testing of all the indicator lamps. When the test pushbutton is depressed a half wave rectified test signal is supplied to the indicator transformer. The operating signal circuit which is also connected to the primary leg of the indicator transformer, in parallel with the test circuit, comprises a bidirectional switchable device which permits normal alternating current to flow when activated. When the bidirectional switchable device, such as a thyristor, is activated the normal alternating current wave will cause the associated indicator lamp to burn more brightly than when energized by the half-wave rectified test signal. The diode in the test circuit, to which the normal operating signal is applied, and the diodes in the other test circuits form back-to-back rectifier circuits to prevent the alternating current signal from one signal circuit from influencing another signal circuit.

When the test pushbutton is depressed unidirectional current flows through the individual rectifiers and the associated indicator transformer, energizing it and lighting the indicator lamp, if it is not already lit due to a normal operating condition. The test circuit uses half-wave rectified current which is satisfactory for momentary testing. Lamps energized with the test signal will not show full brilliance so a check of which lamps are on in the normal mode can be made even while testing. A self-triggering bidirectional thyristor is provided in the operating signal circuit. Test current flowing through the operating signal circuit is prevented by non-conduction of the self-triggering thyristor. A diode is placed in the trigger circuit of the thyristor to prevent a signal from flowing through the thyristor and triggering it on. The bidirectional thyristor is triggered on when a low voltage low current supply is connected to the gate. If the gate is connected to one of the other leads it becomes self triggering in that one direction only. Too much gate current would ruin the device hence a resistor is required. We discovered experimentally that current, when applied to the test circuit, would flow through the coil of the device being monitored and trigger the bidirectional thyristor on. Current would then flow back through the bidirectional thyristor and energize the coil. To provide isolation a diode was added to the trigger circuit. Note that it is back-to-back with the diode in the test circuit.

It is an object of this invention to provide an inexpensive highly reliable circuit for indicator lamps using a small number of reliable components.

It is another object of this invention to provide an indicator lamp circuit utilizing a single transformer for operating each indicator light at a low voltage for safety and to permit use of long life indicator lamps.

It is a further object of this invention to provide a circuit when the test current is a ½ wave rectified signal and the operating circuit signal is a normal ac wave.

BRIEF DESCRIPTION OF THE DRAWINGS

For a better understanding of the invention reference may be had to the preferred embodiment exemplary of the invention shown in the accompanying drawing in which:

FIG. 1 illustrates the test circuit utilizing the teaching of the present invention.

DESCRIPTION OF THE PREFERRED EMBODIMENT

Referring now to the figure there is shown an indicator light circuit utilizing the teaching of the present invention. A plurality of indicator lights 10 are connected to the low voltage side 12 of indicator transformer 14. Each indicator lamp 10 is supplied power from a single indicator transformer 14. Operation of the indicating lamp 10 at a low voltage, such as for example 6 volts, allows for the use of inexpensive bulbs and provides for safe operation. The high voltage side 16 of transformer 14 can be supplied with a higher voltage level, such as normal 120 volts ac. One leg 18 of the primary connection of each indicator transformer 14 is connected to a common line 20. At test signal line is connected between the primary of transformer 14 and a common test line 30. When test pushbutton 34 is depressed, closing the test circuit, the test current travels through the test circuit energizing the signal lamp 10. A diode 26 is disposed in each of the connections from the primary transformer leg 19 to the common test line 30. Diode 26 rectifies the test current which flows through indicator transformer 14 to illuminate signal light 10. When test pushbutton 34 is depressed half wave rectified current flows through all of the indicator transformers energizing all indicator lamps 10.

An operating signal circuit is also connected to the primary leg 19 of each transformer 14. A bidirectional thyristor 22 is disposed in each of the operating signal circuits. The bidirectional thyristor provides isolation and prevents current from reaching the coil and energizing its starter or relay. Bidirectional thyristor 22 comprises an input connection 24, an output connection 25, and a trigger connection 28. The output 25 of bidirectional thyristor 22 is connected to a line 40 through which current flows after the start pushbutton 42 is depressed, closing contacts 44 which seal in relay 46. Self-triggering bidirectional thyristor 22 is triggered on, energizing transformer 14 with alternating current and lighting the lamp 10, when current flows through line 40. The trigger 28 of bidirectional thyristor 22 is connected to the output 25 through resistor 48 and diode 50 connected in series. The diode is placed in the trigger circuit to prevent a signal from flowing through the coil and triggering the bidirectional thyristor 22 ON.

The disclosed circuit provides a novel and improved circuit for simultaneously testing the operativeness of several indicating lamps. This is accomplished by placing a self-triggering bidirectional thyristor circuit in series with the indicator transformer 14. When current flows in the line 40 it triggers bidirectional thyristor 22 on, energizing transformer 14 and lighting lamps 10. A path parallel to the indicator circuit is provided through the common test line 30. Current flow through this parallel path is blocked by back bias diodes 26 in the other test connections. In effect the diodes of adjacent units form a back-to-back rectifier pair with the diode in the test circuit.

When the test pushbutton 34 is depressed current flows through the individual rectifiers 26 energizing transformers 14 and lighting lamps 10 which under normal conditions are lit by operating signals. The test signal is one-half wave rectified ac which for extended operation could have a deleterious effect on the transformer but for momentary test conditions will be satisfactory. The lamps 10 will not show full brilliance when energized by the test signal so an indication of which lamps are energized by a normal operating signal can be determined even during test. The path through the operating signal circuit is blocked by bidirectional thyristor 22 when it is turned off. When bidirectional thyristor 22 is turned on current flows through primary leg 19 due to the operating signal. Diode 50 is placed in the trigger circuit of bidirectional thyristor 22 to prevent a signal from flowing through coil 46 and energizing triac 22.

The disclosed circuit offers advantages over the prior art such as being less complicated and requiring simpler wiring. The disclosed circuit also has the advantage of having a test signal which is of a lower magnitude than a normal operating signal so that normal operation of the lamps can be discerned even during circuit tests. When the transformer 14 is energized with a normal operating signal bidirectional thyristor 22 conducts normal alternating current and puts no abnormal strain on transformer 14 as might occur when it is energized with one half wave rectified current.

We claim:

1. An indicator light circuit operable from an alternating current supply for indicating the operation of a plurality of external devices, comprising:
    a plurality of indicator lights;
    test circuit means connected to all of said plurality of indicator lights for simultaneously energizing all of said plurality of indicator lights when said test circuit means is activated, thereby simultaneously testing the operability of all of said plurality of indicator lights;
    a plurality of indicator circuit means, each connected to an associated indicator light and coupled to an associated external device, for permitting energization of the associated indicator light when activated in response to operation of the associated external device; and
    a bidirectional switchable device disposed between each of said plurality of indicator circuit means and the associated indicator light, said bidirectional switchable device permitting bidirectional current flow through said indicator circuit means when activated in response to operation of an external device and isolating said indicator circuit means from said indicator light when deactivated in response to operation of an external device.

2. An indicator light circuit as claimed in claim 1 comprising:
    a plurality of transformers each disposed with one of said plurality of indicator lights connected to the secondary side, and said test circuit means and one of said plurality of indicator circuit means connected to the primary side.

3. An indicator circuit as claimed in claim 2 wherein:
    each bidirectional switchable device comprises a bidirectional thyristor permitting alternating current flow through each indicator circuit; and, said test circuit comprises a plurality of unidirectional devices each being connected to the primary side of an associated transformer permitting only unidirectional current to flow through said test circuit means.

4. An indicator light circuit as claimed in claim 1 wherein:
    said bidirectional switchable devices comprise a bidirectional thyristor having a trigger means; and,
    a diode connected to said trigger means.

5. An indicator light circuit as claimed in claim 1 wherein:
    said bidirectional switchable device comprises a bidirectional thyristor having an input terminal, an output terminal, and a trigger terminal; and
    a diode disposed in a circuit connection between said trigger terminal and said output terminal.

6. An indicator light circuit operable from an alternating current supply comprising:
    a plurality of indicator lights;
    a plurality of transformers, each having a pair of secondary terminals and a pair of primary terminals, one primary terminal being connected to the alternating current supply, and each transformer being associated with one of said plurality of indicator lights;

each of said plurality of indicator lights being connected across the secondary terminals of one of the associated transformers;

test circuit means for simultaneously testing the operability of all of said plurality of indicator lights, said test circuit means being connected at one end to a primary terminal of each of said plurality of transformers and at the other end to the alternating current supply, said test circuit means being switchable between an open position and a closed position completing a circuit through the primary terminals of all of the transformers across the alternating current supply, thereby simultaneously energizing all of said plurality of indicator lights; and a plurality of indicator circuit means for indicating the operation of external devices, each of said indicator circuit means being associated with one of said transformers, connected to a primary terminal of one of said plurality of associated transformers, and comprising a bidirectional switchable device, each of said bidirectional switchable devices being switchable between a blocking condition preventing full wave current flow through the primary of the associated transformer and a conducting condition allowing bidirectional current flow through the primary of the associated transformer in response to operation of an external device.

7. An indicator light circuit as claimed in claim 6 wherein each of said indicator means comprises:
a bidirectional switchable device comprising an input, an output and a trigger;
said input connected to the primary of the associated transformer;
said trigger and said output being connected together so that said bidirectional switchable device is self-triggering when an external contact completes a circuit through the indicator circuit acros the alternating current supply.

8. An indicator light circuit as claimed in claim 6, wherein:
said bidirectional switchable device comprises a bidirectional thyristor having an input, and output and a trigger.

9. An indicator light circuit as claimed in claim 6 comprising:
circuit means connecting said output and said trigger comprising a diode and a resistor in series, causing said thyristor to be self-triggering in response to current flow through an external circuit to which it is connected; and,
said test circuit means comprising a diode permitting only unidirectional current flow therethrough.

10. An indicator light circuit operable from an alternating current supply for indicating the operation of a plurality of external devices, comprising:
a plurality of indicator lights;
test circuit means connected to each indicator light and comprising a switch which completes a circuit through all indicator lights across the alternating current supply when closed thereby simultaneously testing the operability of all of said indicator lights;
a plurality of switch means switchable between an open position and a closed position completing a circuit through electrical components connected across the alternating current supply; and
a plurality of indicator circuit means each connected at one end to one of said plurality of said indicator lights and at the other end to one of said plurality of said switch means;
each of said indicator circuits comprising a bidirectional thyristor disposed in series in said indicator circuit and being connected in a self-triggering mode to become conductive when said associated switch means closes.

11. An indicator light circuit as claimed in claim 10 wherein:
said bidirectional thyristor comprises an input terminal, an output terminal and trigger terminal; including,
a diode and resistor connected in series between said output terminal and said trigger terminal; and,
said output terminal connected to said switch means.

* * * * *